United States Patent
Gandhi

(12) 
(10) Patent No.: US 8,519,516 B1
(45) Date of Patent: Aug. 27, 2013

(54) SEMICONDUCTOR CONSTRUCTIONS

(75) Inventor: Jaspreet S. Gandhi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/418,113

(22) Filed: Mar. 12, 2012

(51) Int. Cl.
*H01L 23/498* (2006.01)
*H01L 21/768* (2006.01)

(52) U.S. Cl.
USPC .... 257/621; 257/773; 257/774; 257/E23.067; 257/E23.174

(58) Field of Classification Search
USPC .......... 257/621, 773, 774, E23.067, E23.174
See application file for complete search history.

(56) References Cited

U.S. PATENT DOCUMENTS

| | | | |
|---|---|---|---|
| 6,943,106 B1 | 9/2005 | Kirby et al. | |
| 7,626,269 B2 | 12/2009 | Oliver et al. | |
| 7,691,748 B2 | 4/2010 | Han | |
| 7,855,140 B2 | 12/2010 | Watkins et al. | |
| 2006/0111243 A1* | 5/2006 | Gan et al. ........ | 505/193 |
| 2009/0008794 A1 | 1/2009 | Wu et al. | |
| 2010/0090319 A1* | 4/2010 | Hsu et al. ........ | 257/621 |
| 2010/0178766 A1 | 7/2010 | Andry et al. | |
| 2010/0276787 A1* | 11/2010 | Yu et al. ........ | 257/621 |
| 2011/0193221 A1 | 8/2011 | Hu et al. | |
| 2012/0133041 A1* | 5/2012 | Phee et al. ........ | 257/737 |

OTHER PUBLICATIONS

Jourdain et al., "Integration of TSVs, Wafer Thinning and Backside Passivation on Full 300mm CMOS Wafers for 3D Applications", IEEE, Electronic Components and Technology Conference (ECTC), 2011, pp. 1122-1125. Abstract Only.

Kwon et al., "Novel Thinning/Backside Passivation for Substrate Coupling Depression of 3D IC", IEEE, Electronic Components and Technology Conference (ECTC), 2011, pp. 1395-1399. Abstract Only.

Pargfrieder et al., "Temporary Bonding and DeBonding Enabling TSV Formation and 3D Integration for Ultra-Thin Wafers", IEEE, Electronics Packaging Technology Conference, 2008, pp. 1301-1305. Abstract Only.

* cited by examiner

*Primary Examiner* — Peniel M Gumedzoe
(74) *Attorney, Agent, or Firm* — Wells St. John P.S.

(57) ABSTRACT

Some embodiments include a planarization method. A liner is formed across a semiconductor substrate and along posts that extending upwardly from the substrate. Organic fill material is formed over the liner and between the posts. A planarized surface is formed which extends across the posts and across one or both of the liner and the fill material. Some embodiments include a semiconductor construction containing a semiconductor die. Electrically conductive posts extend through the die. The posts have upper surfaces above a backside surface of the die, and have sidewall surfaces extending between the backside surface and the upper surfaces. A liner is across the backside surface of the die and along the sidewall surfaces of the posts. Electrically conductive caps are over the upper surfaces of the posts, and have rims along the liner adjacent the sidewall surfaces of the posts.

8 Claims, 20 Drawing Sheets

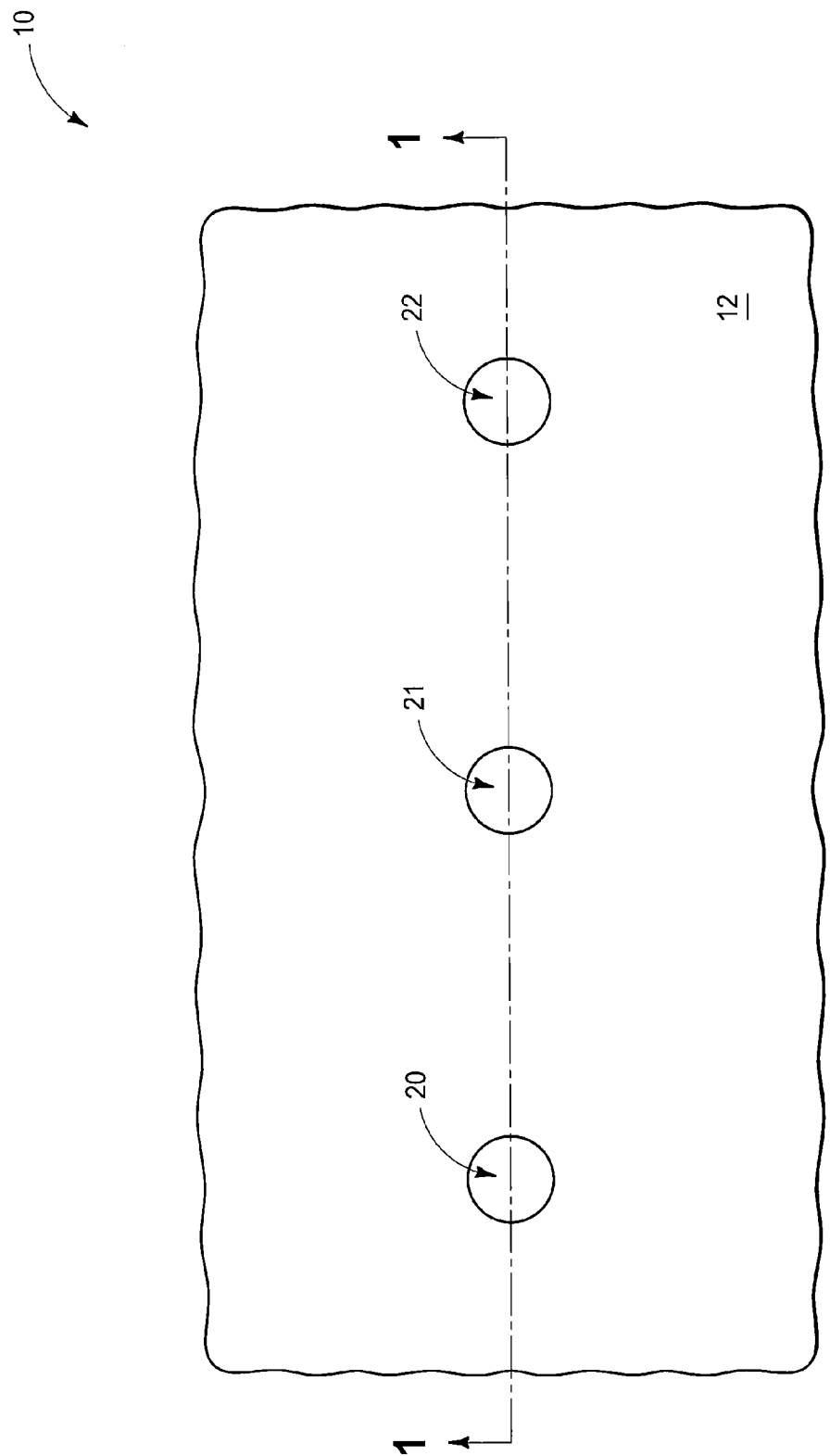

US 8,519,516 B1

SEMICONDUCTOR CONSTRUCTIONS

TECHNICAL FIELD

Semiconductor constructions and methods of planarizing across a plurality of electrically conductive posts.

BACKGROUND

Commercial production of integrated circuit devices, such as memory dice, may involve fabrication of a large number of identical circuit patterns on a single semiconductor wafer or other bulk semiconductor substrate. It is a continuing goal of semiconductor manufacturers to increase the density of semiconductor devices fabricated on a given size of semiconductor substrate to achieve increased yield of semiconductor devices and enhanced performance thereof.

One method for increasing the density of semiconductor devices in a semiconductor assembly is to create vias (i.e., through-holes) that extend entirely through a semiconductor die; and specifically that extend from an active surface of the die to the opposing backside surface of the die. The vias may be filled with electrically conductive material to form through-substrate interconnects that provide electrical pathways from the active surface of the die to the backside surface of the die. The through-substrate interconnects may be electrically coupled to electrical contacts that are along the backside of the die, and that extend to circuit components external of the die. In some applications, the die may be incorporated into a three-dimensional multichip module (3-D MCM), and the circuit components external of the die may be comprised by another semiconductor die and/or by a carrier substrate.

Various methods for forming through-substrate interconnects in semiconductor substrates have been disclosed. For instance, U.S. Pat. Nos. 7,855,140, 7,626,269 and 6,943,106 describe example methods that may be utilized to form through-substrate interconnects.

Various problems may be encountered during the fabrication of through-substrate interconnects. For instance, electrically conductive posts of the through-substrate interconnects may extend above a backside surface of a semiconductor die at a processing stage, and it may be desired to planarize such posts to form a planarized surface extending across the posts and the die. However, copper within the posts may smear during the planarizing; and/or the posts may tip or break during the planarizing. It is desired to develop new methods of forming through-substrate interconnects which alleviate, prevent and/or overcome problems encountered with conventional processing. It is further desired to develop new through-substrate interconnect architectures.

BRIEF DESCRIPTION OF THE DRAWINGS

FIG. 1A is a top view of the construction of FIG. 1; with the view of FIG. 1 being along the line 1-1 of FIG. 1A.

DETAILED DESCRIPTION OF THE ILLUSTRATED EMBODIMENTS

In some embodiments, the invention includes methods for forming a planarized surface across a plurality of electrically conductive posts. Such posts may correspond to through-substrate interconnects, and in some embodiments may comprise copper.

Example embodiments are described with reference to FIGS. 1-15.

Figure 1:
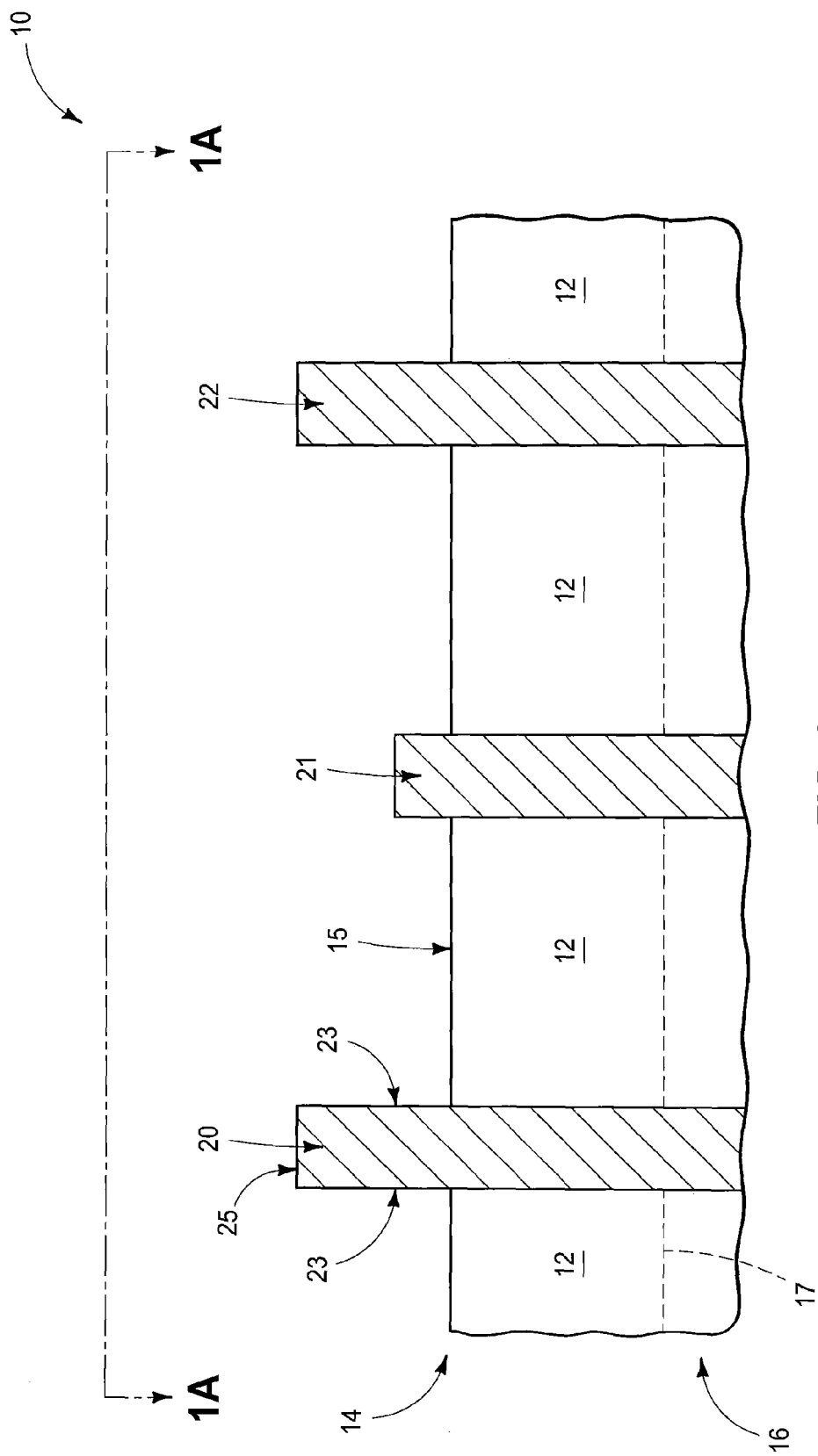
FIGS. 1-7 are diagrammatic cross-sectional views of a portion of a construction at various process stages of an example embodiment method.

Referring to FIGS. 1 and 1A, a semiconductor construction 10 is shown to comprise a plurality of electrically conductive posts 20-22 which extend into a semiconductor base 12. In some embodiments, the base 12 may correspond to a semiconductor die. Such die has a backside 14 and a frontside 16. Integrated circuitry (not shown) may be associated with the frontside, and a dashed line 17 is provided to diagrammatically illustrate an approximate boundary of the circuitry within the die. The integrated circuitry may comprise memory (for instance, NAND, DRAM, etc.), logic, etc. Although the integrated circuitry may be predominantly associated with the frontside, in some embodiments there may also be integrated circuitry associated with the backside.

The backside has a surface 15. The posts 20-22 have top surfaces above backside surface 15 and sidewall surfaces extending from the top surfaces to the backside surface 15. For instance, conductive post 20 is shown to comprise a top surface 25, and to comprise sidewall surfaces 23 extending from the top surface 25 to the backside surface 15 of base 12.

The base would also have a frontside surface, and in some embodiments the posts 20-22 may pass entirely through the die so that the posts have surfaces along the frontside surface of the die. The frontside surface is not illustrated in FIG. 1. The frontside surface of the die may be joined to a carrier wafer (not shown) at the processing stage of FIGS. 1 and 1A to assist in transporting the die through processing equipment.

Base 12 may comprise monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

The electrically conductive posts 20-22 may comprise any suitable electrically conductive compositions or combinations of compositions. In some embodiments, the posts may comprise one or more electrically conductive compositions formed within through-substrate vias (TSVs). In some embodiments, the posts may comprise copper.

In the shown embodiment of FIGS. 1 and 1A, the posts are formed to varying distances above the backside surface 15 of base 12. Such non-uniformity of exposed post dimensions may result from, for example, the processing utilized to fabricate the posts and/or total thickness variation (TTV) occurring during or after grinding of surfaces of the posts. The variation in exposed post dimension may be greater than 1 micrometer, greater than 10 micrometers, etc., in some embodiments.

Figure 2:
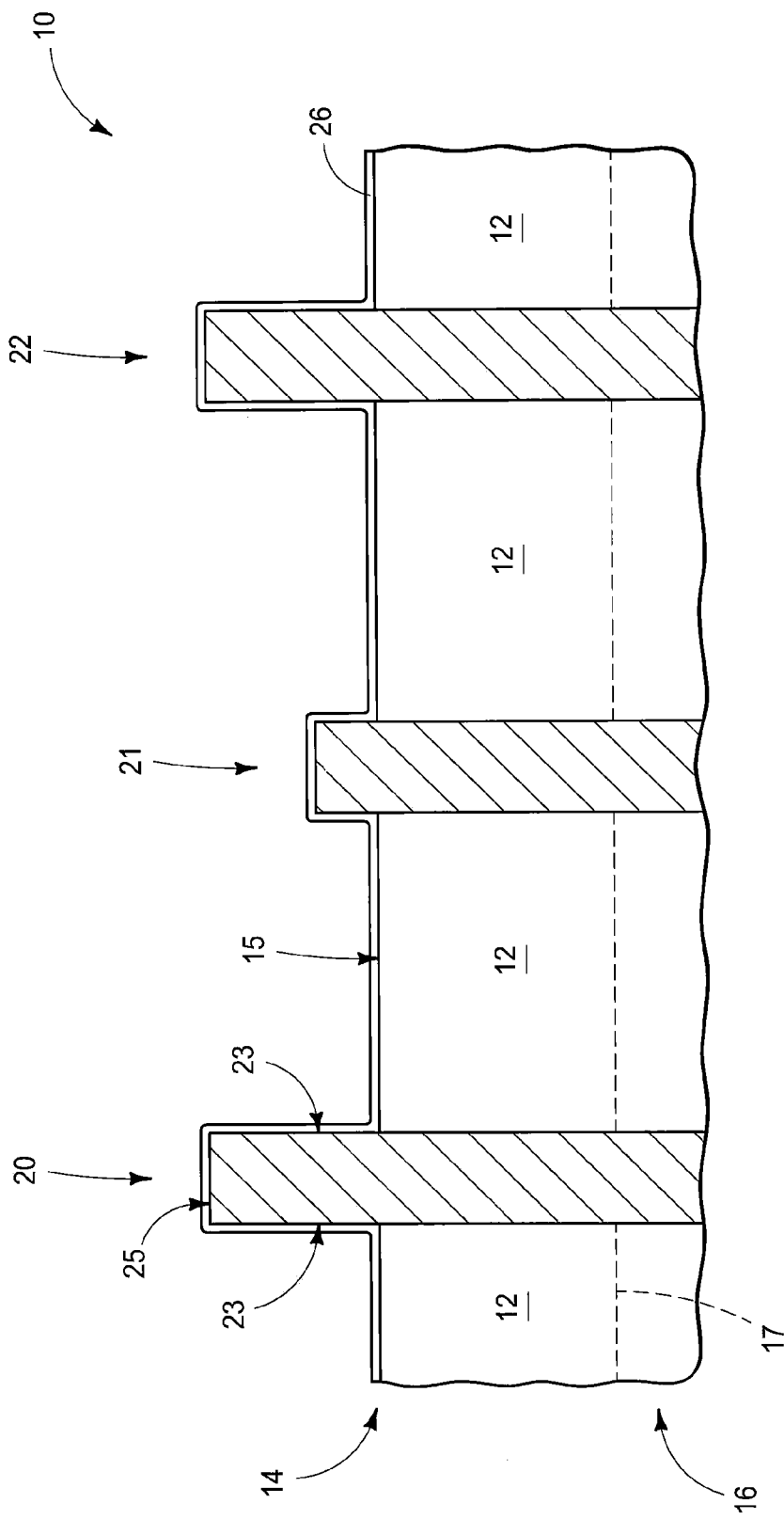

Referring to FIG. 2, a liner 26 is formed across surface 15, and along the sidewall and top surfaces of posts 20-22. The liner 26 may comprise any suitable composition or combination of compositions. Although the liner is shown to be a single homogeneous composition, in some embodiments the liner may comprise two or more discrete materials. For instance, the liner may comprise silicon dioxide over silicon nitride. In some embodiments, the liner 26 consists of inorganic material. In some embodiments, the liner comprises a copper barrier material, such as a material comprising, consisting essentially of or consisting of ruthenium or ruthenium oxide. The copper barrier material may be utilized in combination with posts comprising copper, and may alleviate or prevent copper diffusion that could otherwise occur from the copper-containing posts. The ruthenium-containing materials may be utilized alone, or in combination with one or both of silicon dioxide and silicon nitride. Accordingly, in some example embodiments, the liner 26 comprises, consists essentially of, or consists of one or more of silicon dioxide, silicon nitride and ruthenium.

The liner 26 may be formed by any suitable method, including, for example, atomic layer deposition (ALD), chemical vapor deposition (CVD), and physical vapor deposition (PVD).

The liner be formed to any suitable thickness, and in some embodiments will be formed to a thickness of less than or equal to 500 nanometers.

In some embodiments, it may be desired to form liner 26 at low temperature (i.e., at a temperature of less than or equal to about 200° C.) in order to avoid adversely affecting circuitry associated with base 12. In such embodiments, the liner may comprise, consist essentially of, or consist of silicon nitride deposited at a temperature of less than or equal to about 200° C.

Figure 3:
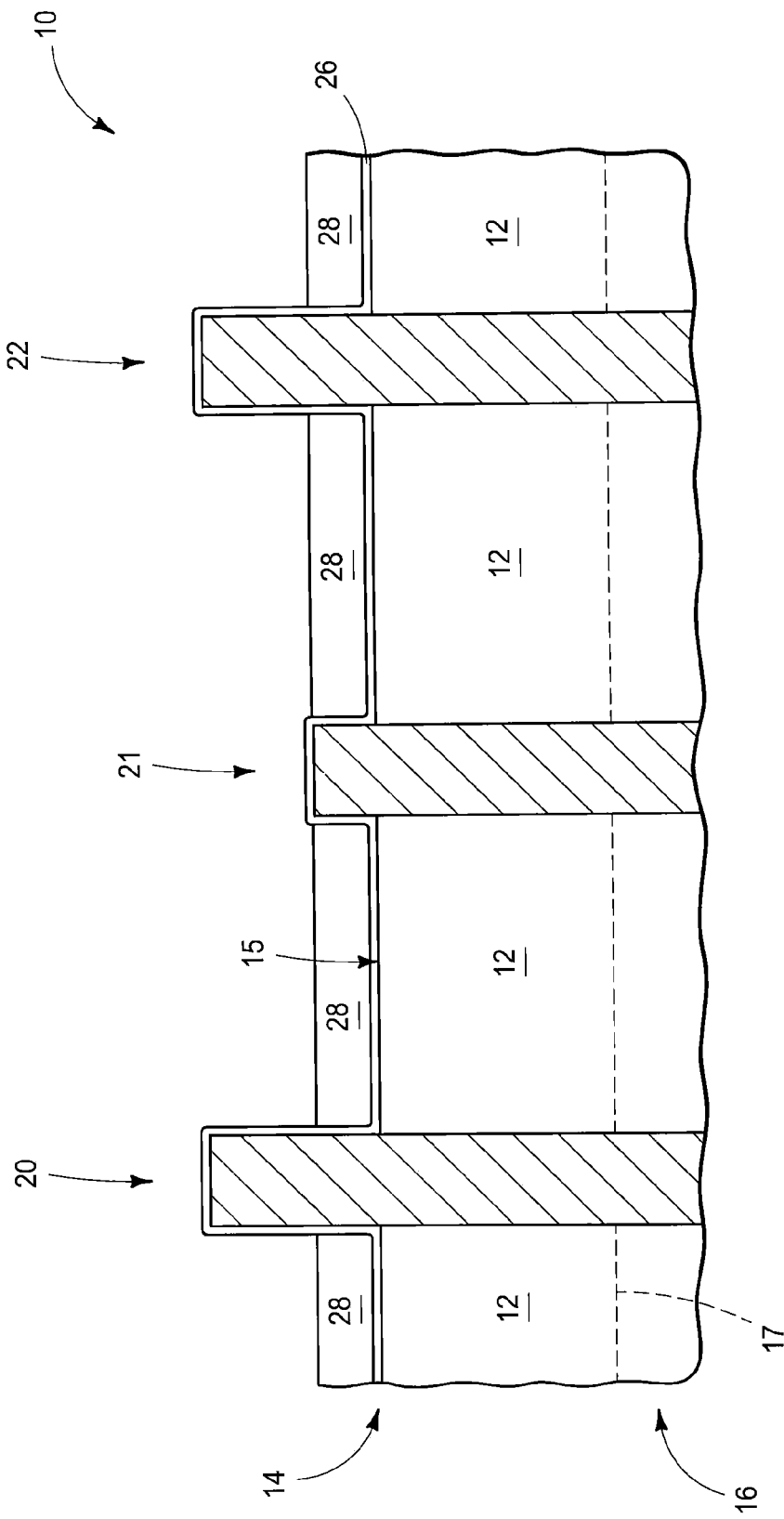

Referring to FIG. 3, fill material 28 is formed over liner 26 and between posts 20-22. In the shown embodiment, the fill material is provided within regions between the posts, but is not provided over the posts. In other embodiments (such as an embodiment shown in FIG. 8), the fill material may be provided to a thickness which covers at least some of the posts.

The fill material may comprise any suitable composition or combination of compositions; and in some embodiments may comprise one or more organic (i.e., carbon-containing) compositions. For instance, in some embodiments the fill material 28 may comprise, consist essentially of, or consist of photoresist.

The fill material may be provided to any suitable thickness. In some embodiments, the fill material may be provided to a thickness within a range of from about 500 nanometers to about 4 microns. In some embodiments, the combined thickness of the fill material and the liner may be within a range of from about 500 nanometers to about 5 microns.

Figure 4:
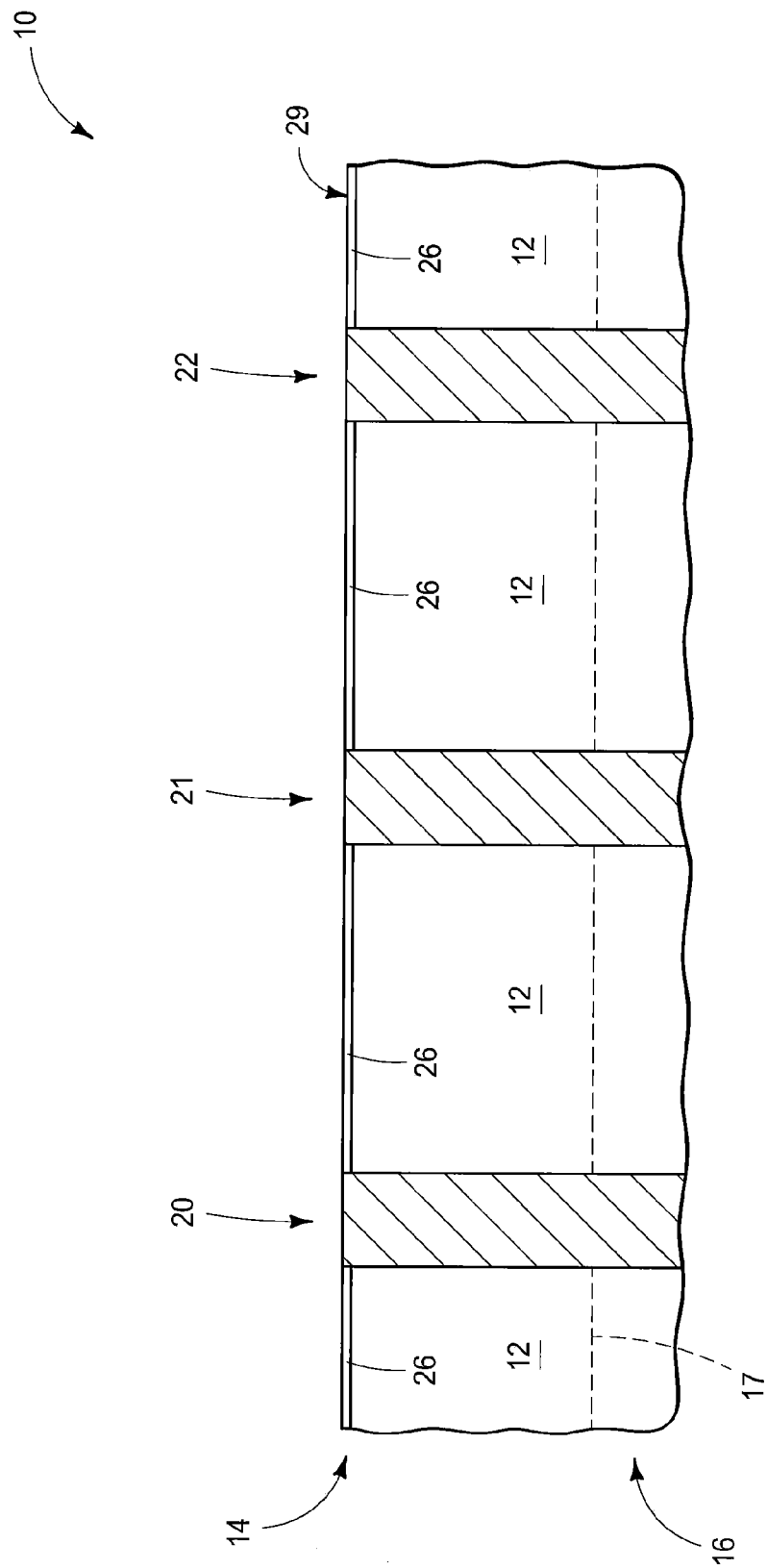

Referring to FIG. 4, construction 10 is subjected to planarization to form a planarized surface 29. The planarization may be accomplished utilizing any suitable methodology; such as, for example, chemical-mechanical polishing (CMP). In the shown embodiment, the planarization removes fill material 28 (FIG. 3), and forms the planarized surface 29 extending across liner 26 and posts 20-22. In other embodiments (such as, for example, an embodiment described below with reference to FIG. 9), the planarized surface may extend across the fill material and posts.

Figure 5:
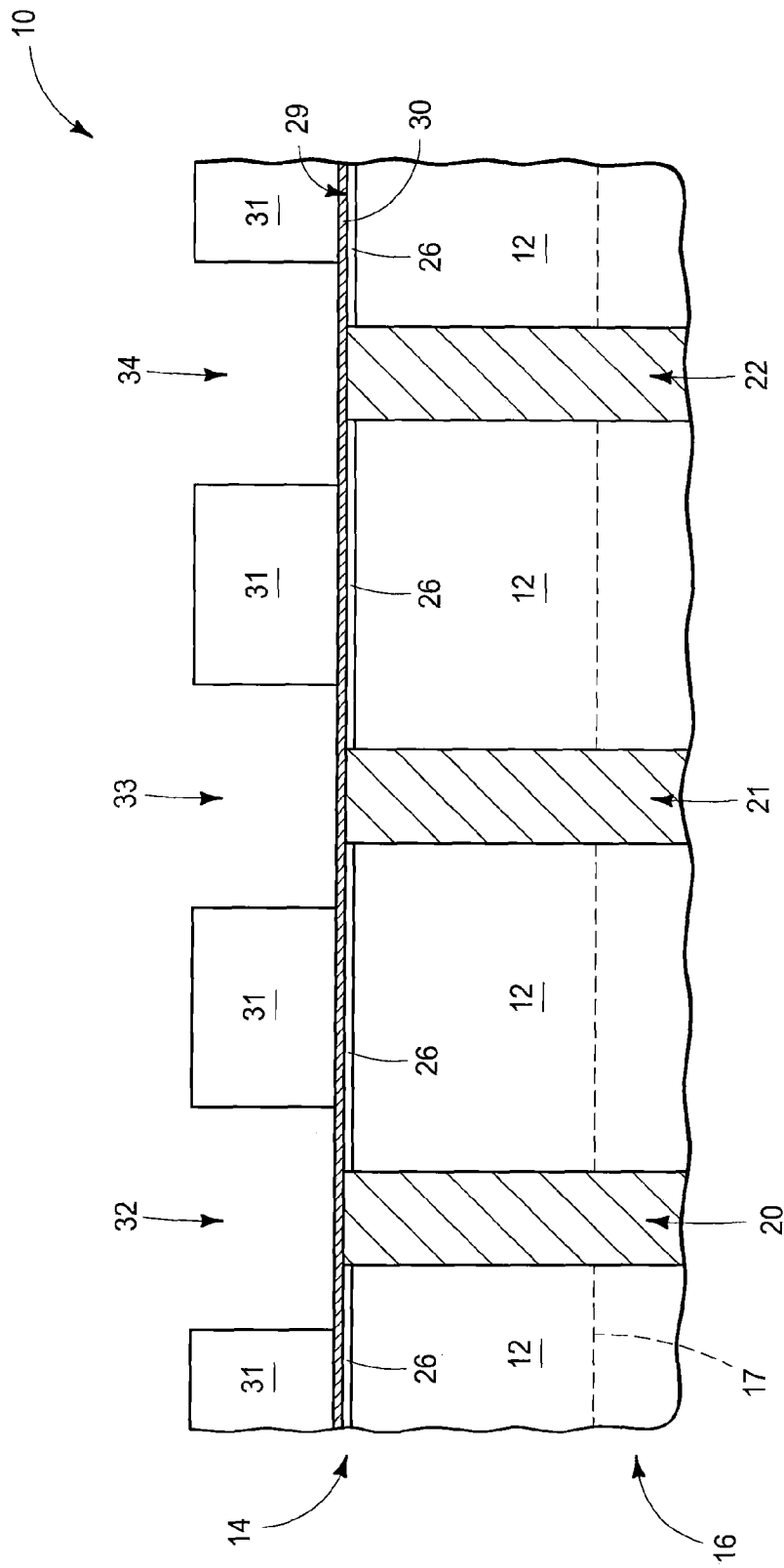

Referring to FIG. 5, electrically conductive material 30 is formed across planarized surface 29, and patterned masking material 31 is formed over the electrically conductive material. In some embodiments, the electrically conductive material may comprise copper, and may be utilized as a seed material for subsequent electrolytic growth of copper (for instance, the material 30 may comprise, consist essentially of, or consist of a mixture of titanium and copper). In some embodiments, the patterned masking material 31 may comprise photolithographically-patterned photoresist.

The patterned masking material has openings 32-34 extending therethrough to expose regions above posts 20-22, respectively.

Figure 6:
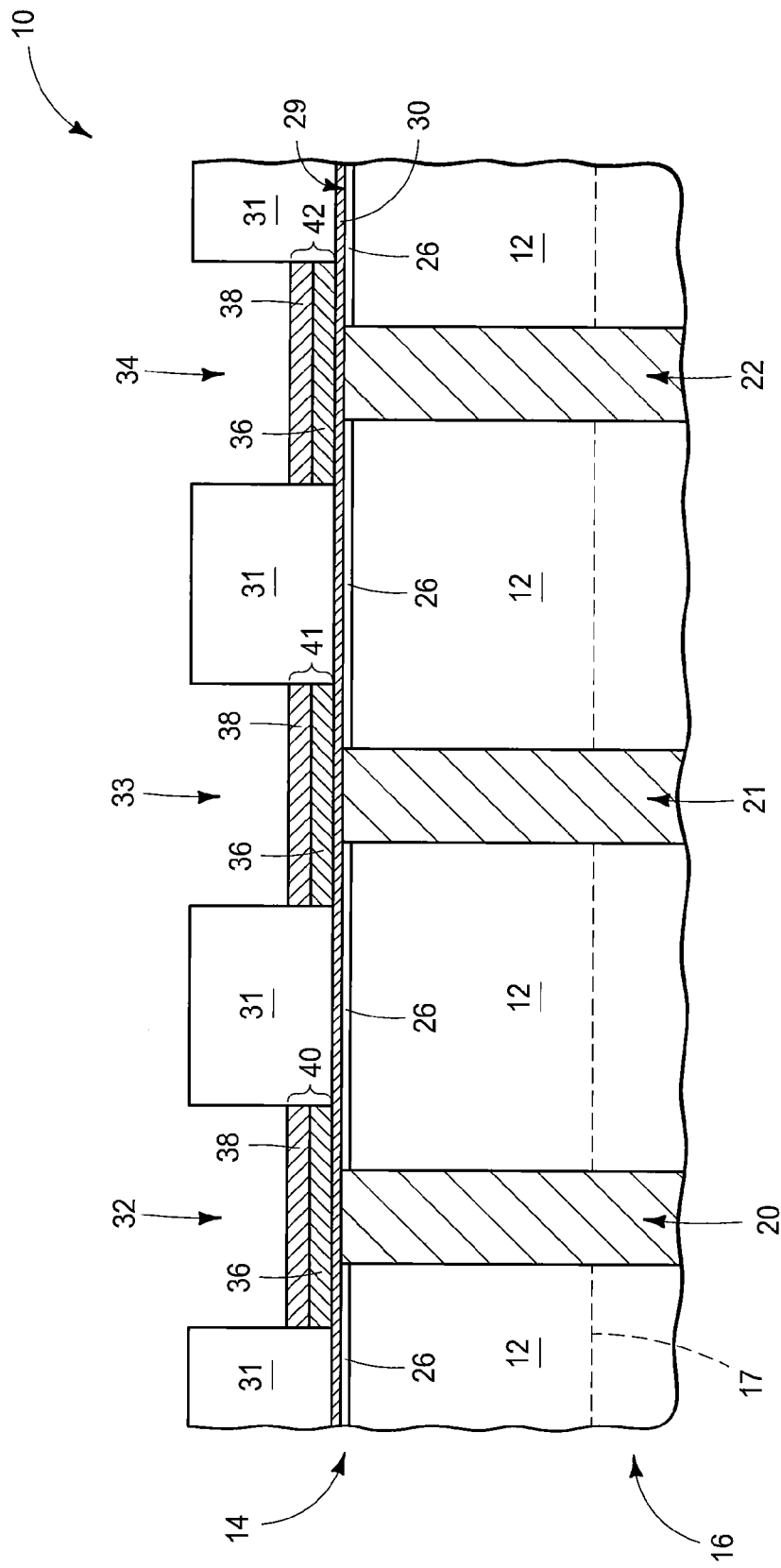

Referring to FIG. 6, electrically conductive materials 36 and 38 are formed within openings 32-34. In some embodiments, material 36 may comprise, consist essentially of, or consist of copper grown over the electrically conductive material 30; and material 38 may comprise nickel or palladium. Although two materials 36 and 38 are formed within openings 32-34 in the shown embodiment, in other embodiments a single conductive material may be formed within the openings, or more than two materials may be formed within such openings. For instance, both of nickel and palladium may be formed over the copper-containing material 36 in some embodiments. The materials 36 and 38 may be ultimately incorporated into under bump metallurgy (UBM), and thus may comprise conventional compositions suitable for utilization in UBM in some embodiments.

The materials 36 and 38 together form stacks 40-42 within the openings 32-34, respectively. Such stacks are spaced-apart from one another by intervening regions of the masking material 31 in the shown embodiment.

Figure 7:
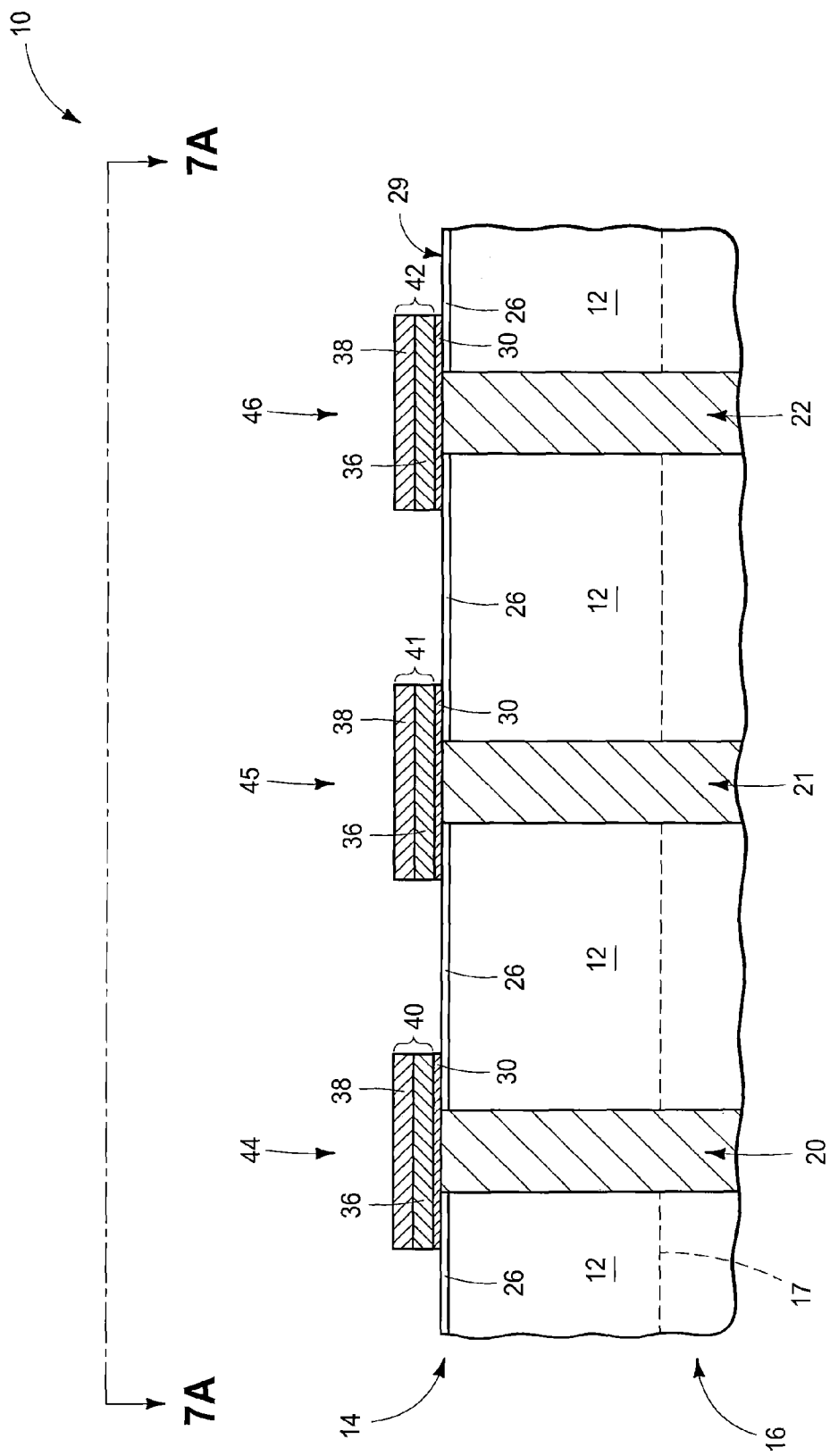
Figure 7A:
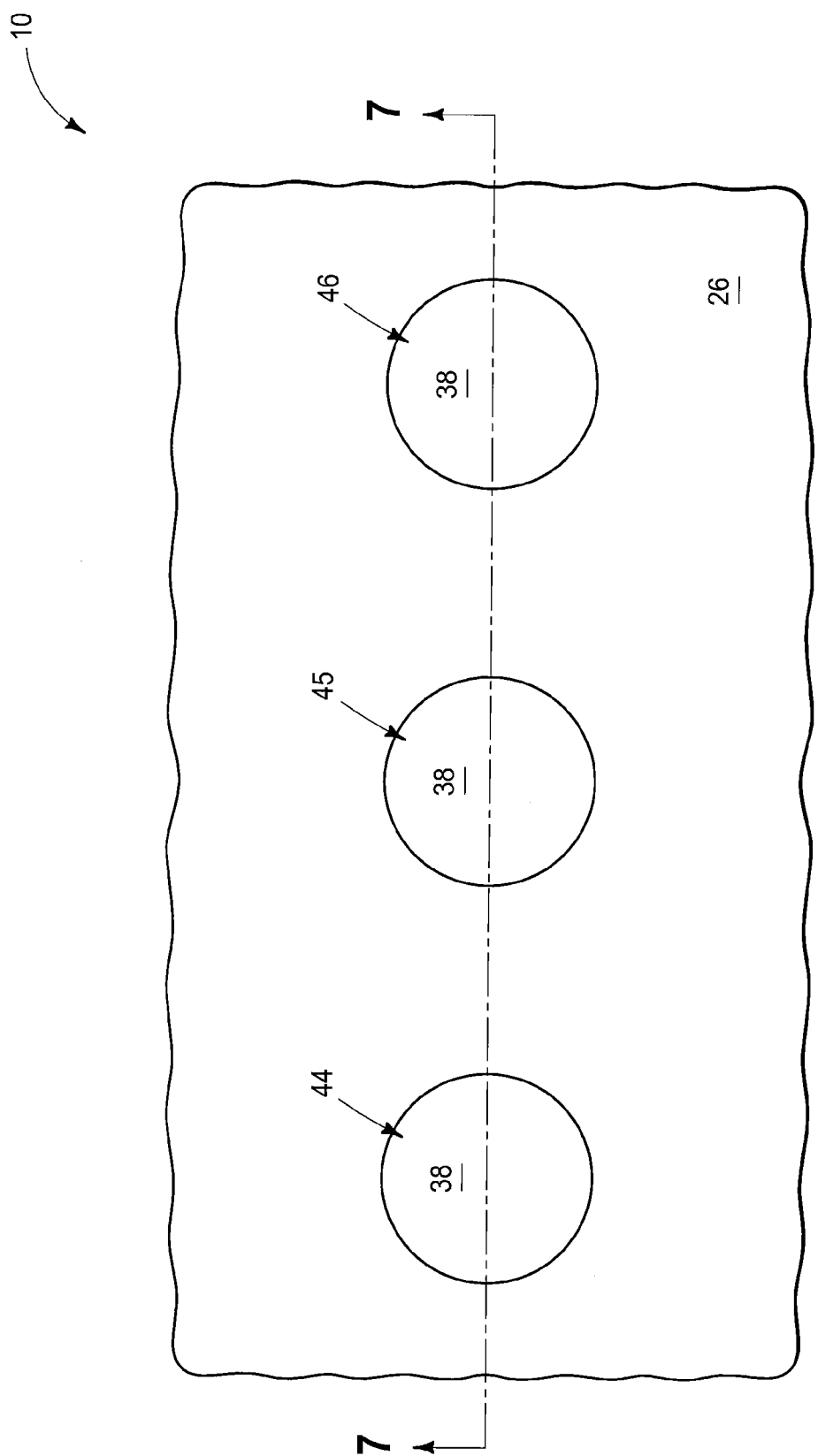
FIG. 7A is a top view of the construction of FIG. 7; with the view of FIG. 7 being along the line 7-7 of FIG. 7A.

Referring to FIGS. 7 and 7A, masking material 31 (FIG. 6) is removed, and subsequently stacks 40-42 are utilized as a hard mask during etching of material 30. The construction of FIGS. 7 and 7A may be considered to comprise a plurality of electrically conductive caps 44-46 which comprise material 30 in combination with the materials 36 and 38 of stacks 40-42. The caps 44-46 are in one-to-one correspondence with the posts 20-22, and may ultimately correspond to UBM utilized for electrically coupling solder balls or other wiring components (not shown) with the posts.

The caps 44-46 may have any suitable shapes, and FIG. 7A shows an embodiment in which the caps are circular.

Another example embodiment method for forming a planarized surface extending across multiple electrically conductive posts is described with reference to FIGS. 8-12.

Figure 8:
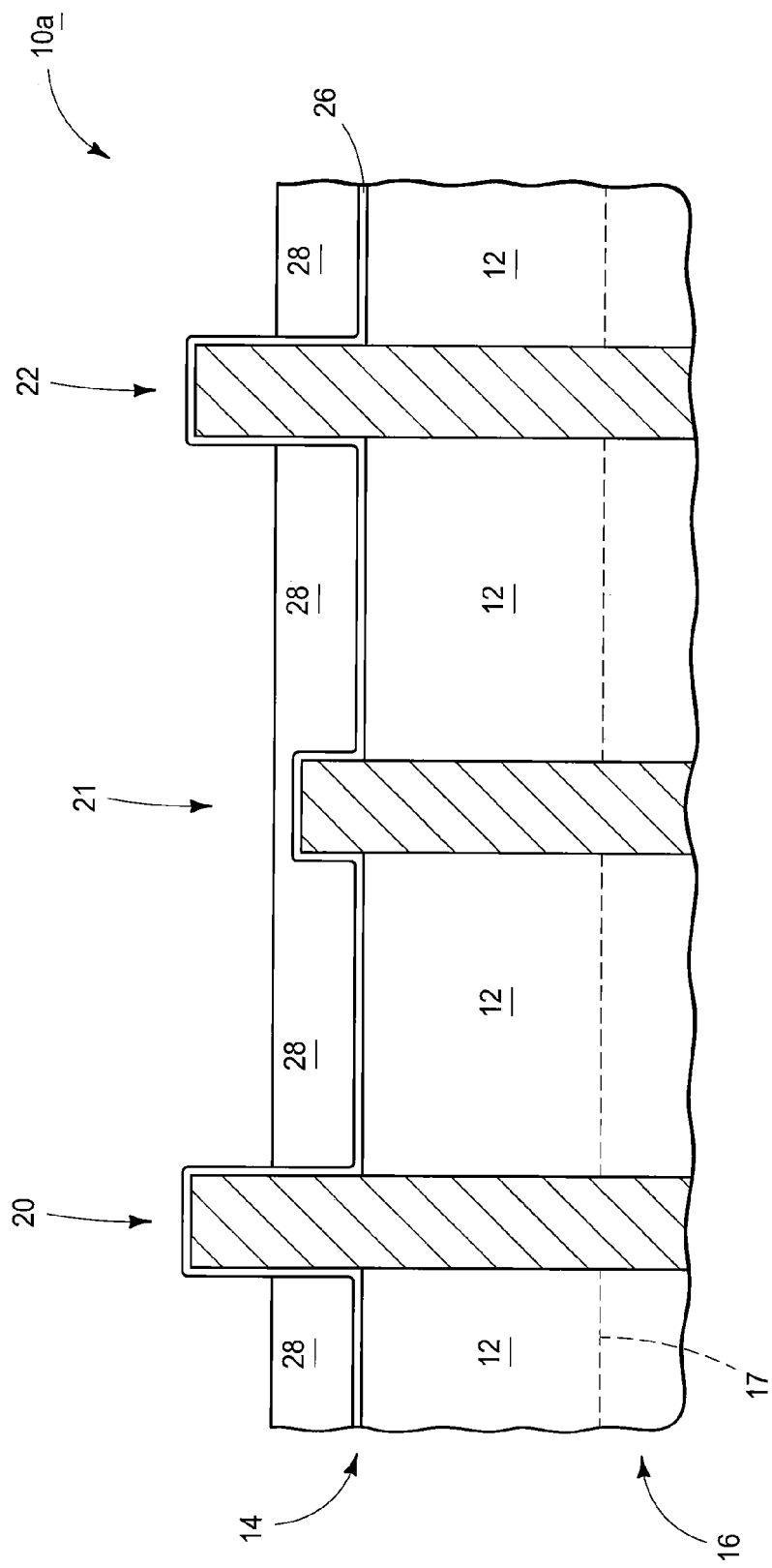
FIGS. 8-12 are diagrammatic cross-sectional views of a portion of a construction at various process stages of an example embodiment method.

Referring to FIG. 8, a construction 10a is shown at a processing stage analogous to that described above with reference to FIG. 3. The construction of FIG. 8 differs slightly from that of FIG. 3 in that the fill material 28 is shown to cover post 21. Such difference is provided in order to illustrate that the depth of fill material 28 may vary in various embodiments. In some embodiments the fill material 28 may be provided to the same depth at the processing stage of FIG. 8 as was illustrated at the processing stage of FIG. 3, or vice versa.

Figure 9:
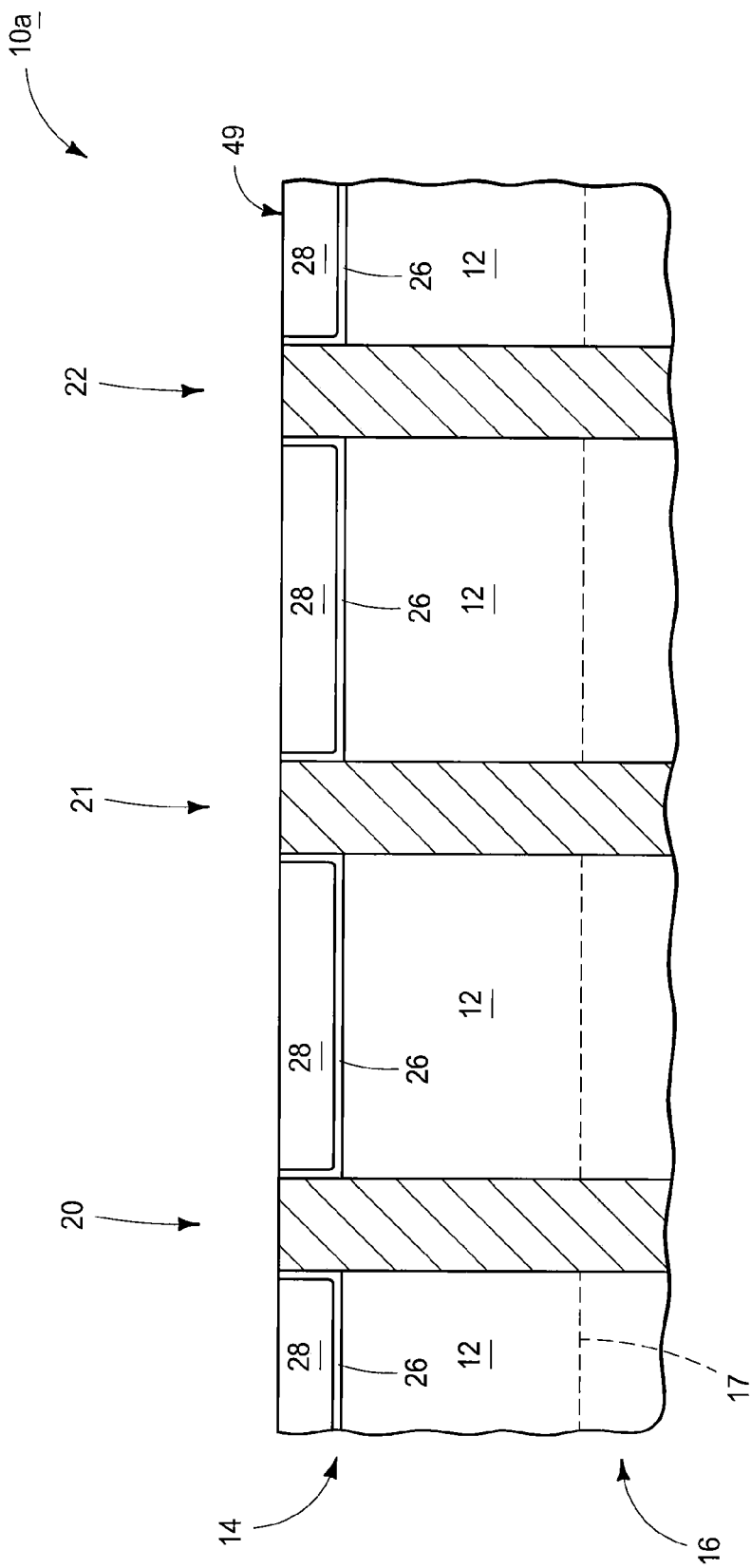

Referring to FIG. 9, a planarized surface 49 is formed across construction 10a. Such planarized surface may be formed utilizing, for example, CMP. The planarized surface extends across posts 20-22 and across fill material 28. In the shown embodiment, the planarized surface also extends across portions of liner 26 adjacent sidewalls of posts 20-22.

Figure 10:
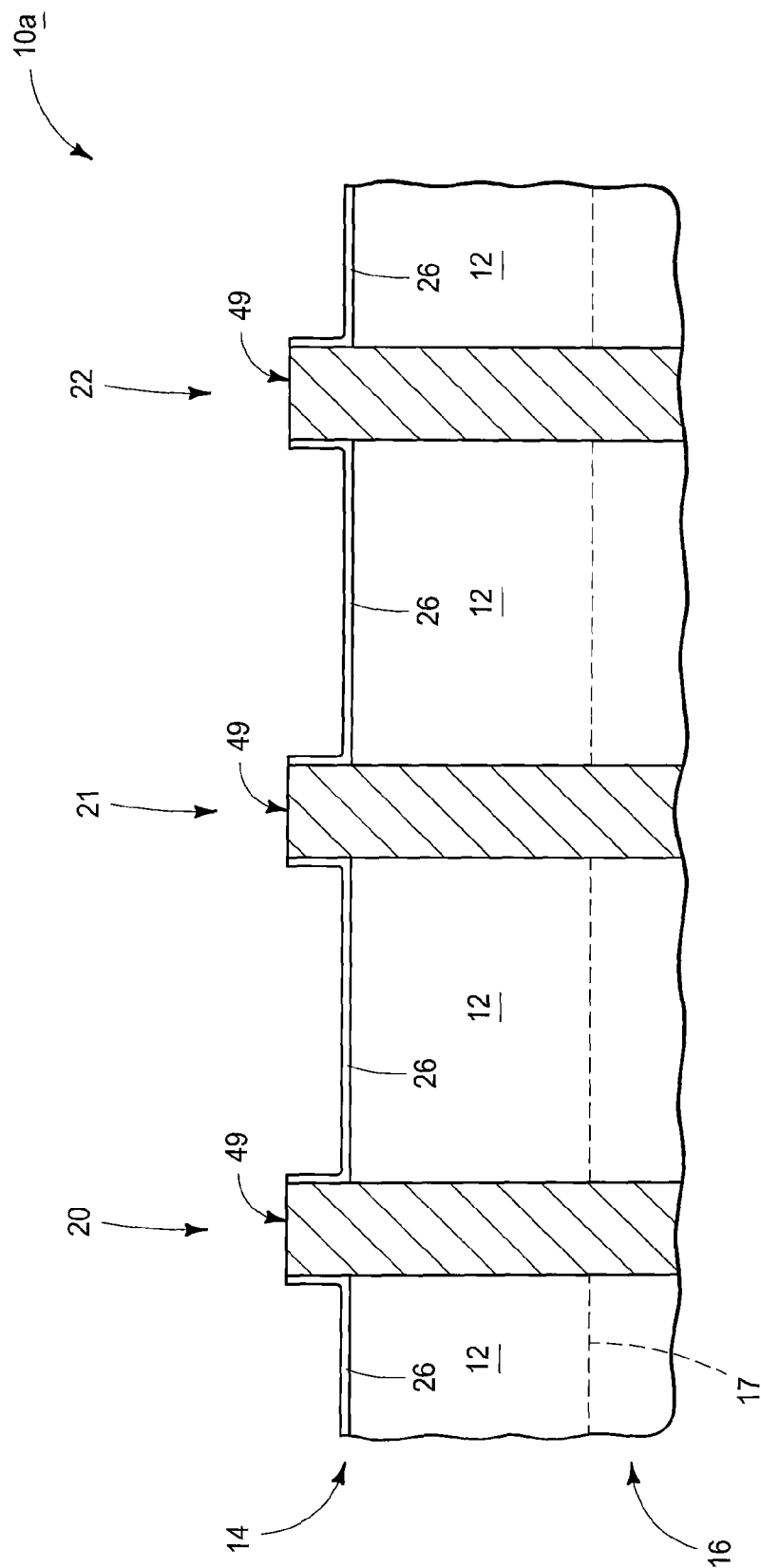

Referring to FIG. 10, fill material 28 (FIG. 9) is selectively removed relative to liner 26 and posts 20-22. In some embodiments, the fill material comprises an organic composition (for instance photoresist), and is selectively removed relative to inorganic compositions of liner 26 and posts 20-22 utilizing oxidizing conditions (for instance, $O_2$ in the presence of plasma). Top regions of the posts 20-22 comprise the planarized surface 49.

Figure 11:
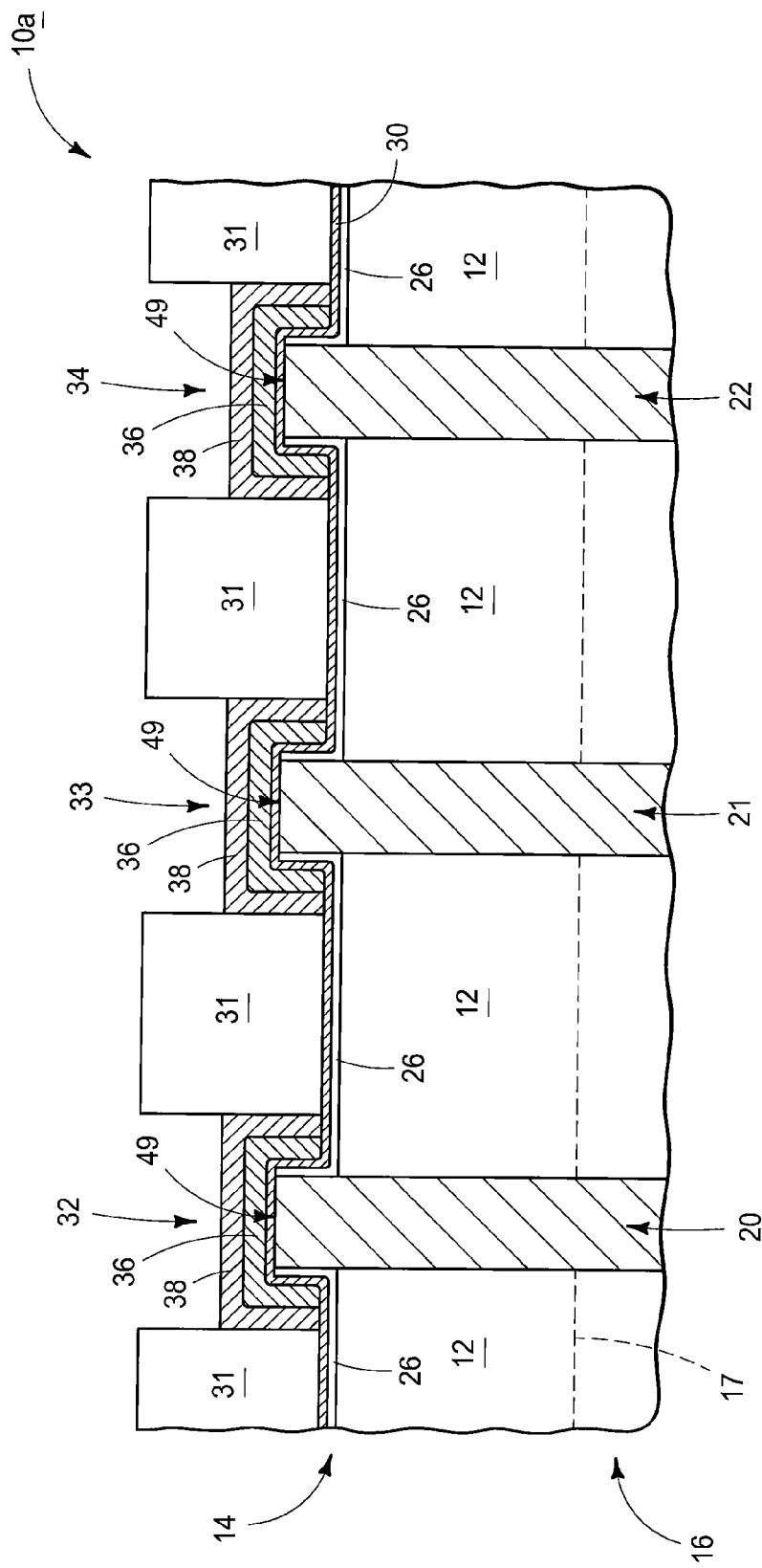

Referring to FIG. 11, electrically conductive material 30 is formed across liner 26 and posts 20-22, patterned masking material 31 is formed over material 30, and the conductive materials 36 and 38 are formed within the openings 32-34 that extend through the masking material 31.

Figure 12:
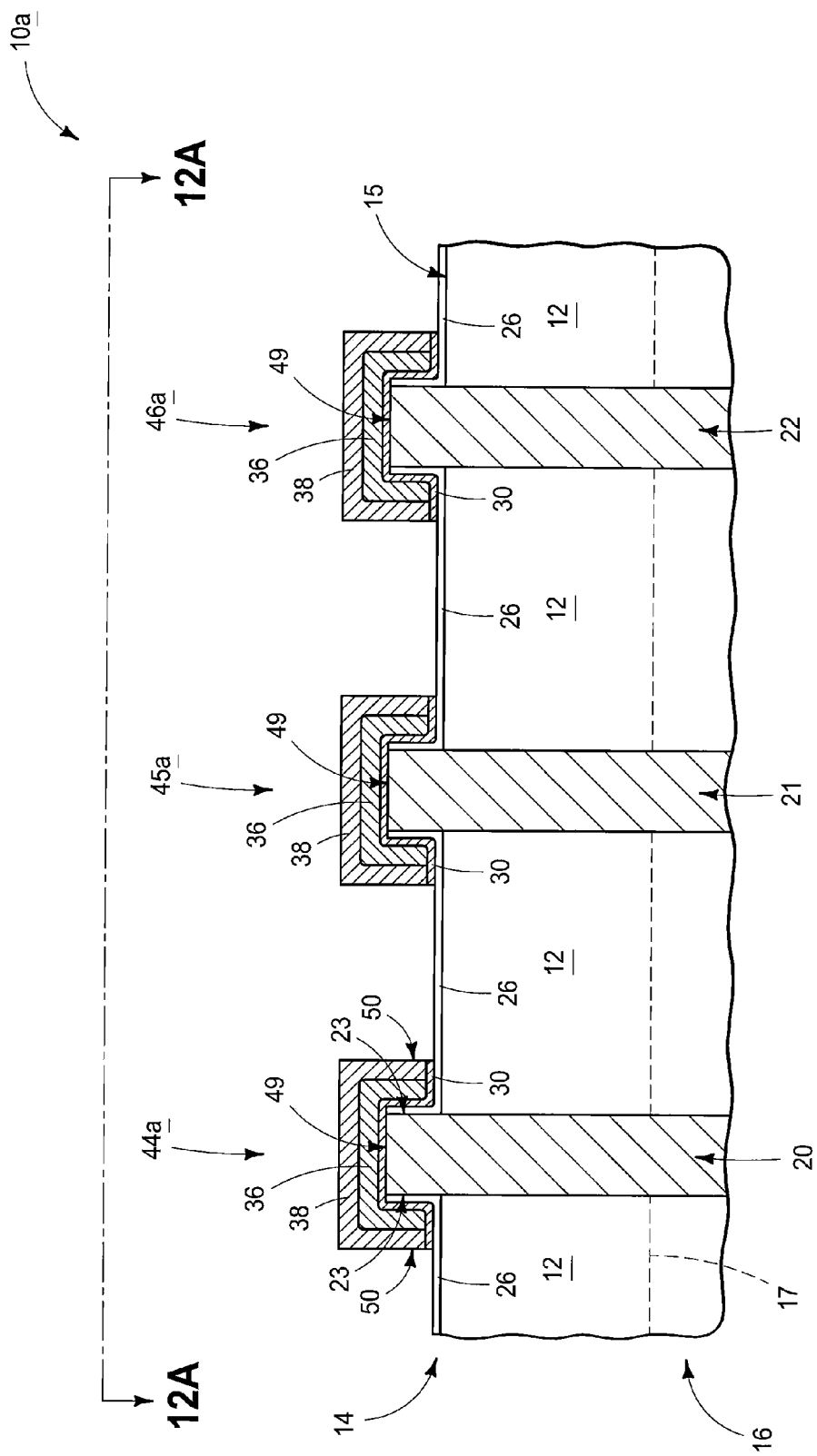
Figure 12A:
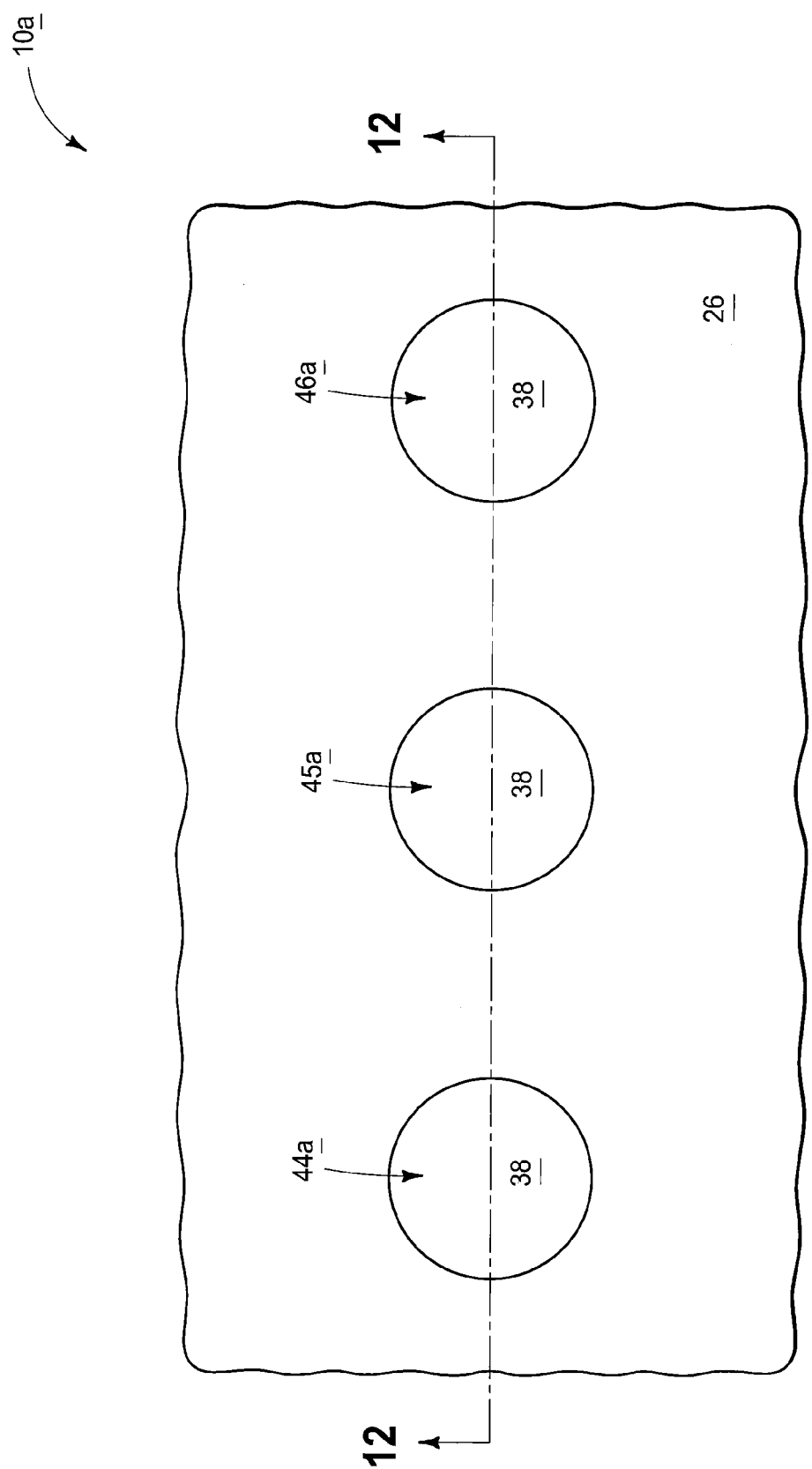
FIG. 12A is a top view of the construction of FIG. 12; with the view of FIG. 12 being along the line 12-12 of FIG. 12A.

Referring to FIGS. 12 and 12A, construction 10a is shown at a processing stage analogous to that of FIGS. 7 and 7A. The masking material 31 (FIG. 11) has been removed, and materials 30, 36 and 38 are incorporated into a plurality of electrically conductive caps 44a-46a. In some embodiments, material 30 is formed directly against liner 26 and upper surfaces of the posts (as shown), and material 36 corresponds to copper-containing material electrolytically grown on material 30.

In the shown embodiment of FIGS. 12 and 12A, the posts 20-22 have planarized upper surfaces corresponding to the planarized surface 49, and have sidewall surfaces extending from the planarized upper surfaces to the backside surface 15 of base 12. For instance, post 20 has the illustrated sidewall surfaces 23. In the shown embodiment, the conductive material 30 is directly against upper surfaces of the posts, and thus the caps 44a-46a are directly against the planarized upper surfaces of the posts. The caps 44a-46a have regions that extend down along the sidewall surfaces of the posts. For instance, the cap 44a is shown to have regions 50 extending along the sidewall surfaces 23 of post 20. The regions of the caps along the sidewalls may be referred to as "rims," and are separated from the sidewall surfaces of the posts by liner 26 in the shown embodiment.

The caps 44a-46a may have any suitable shapes, and FIG. 12A shows an embodiment in which the caps are circular.

Another example embodiment method for forming a planarized surface extending across multiple electrically conductive posts is described with reference to FIGS. 13-15.

Figure 13:
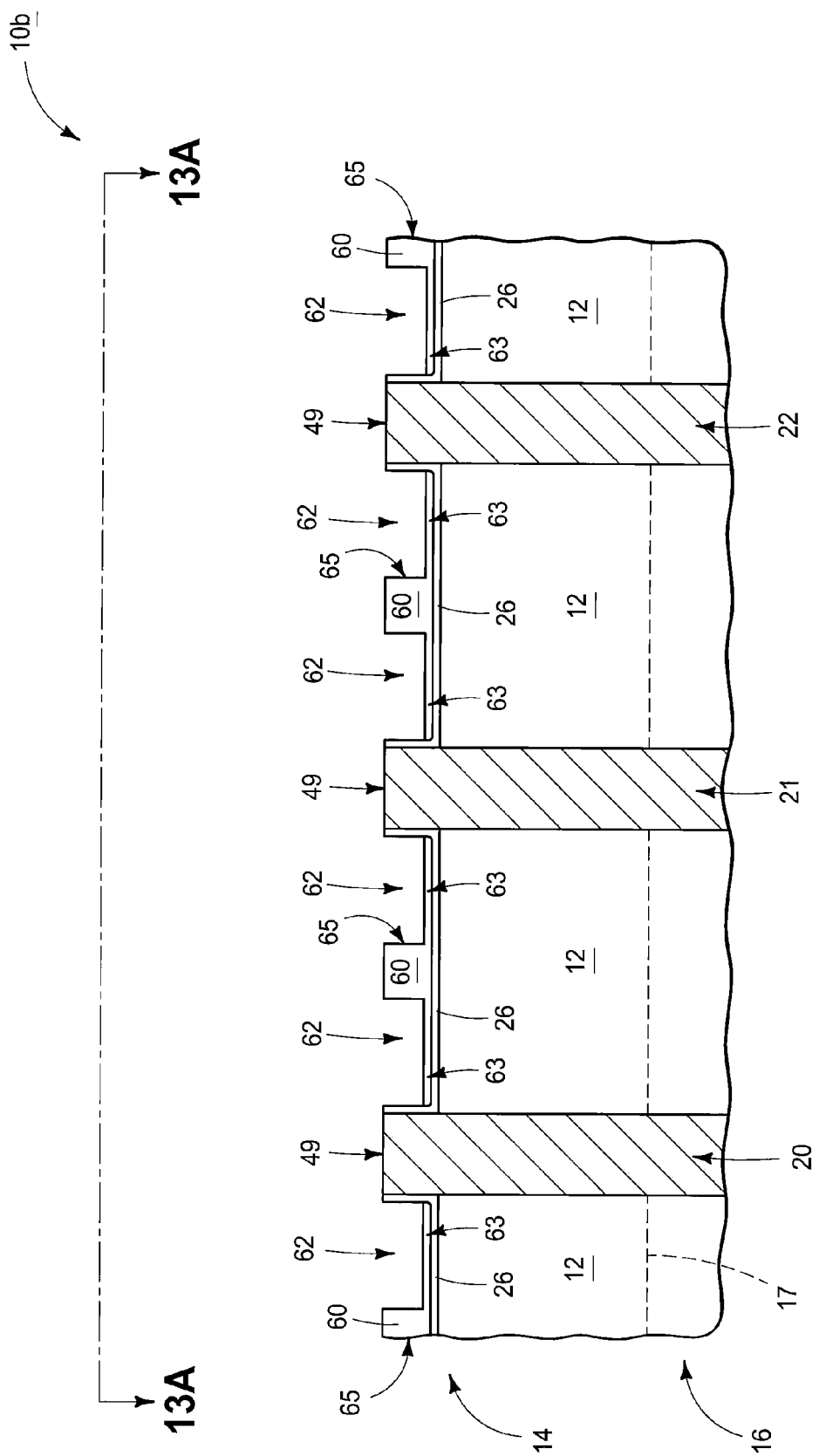
FIGS. 13-15 are diagrammatic cross-sectional views of a portion of a construction at various process stages of an example embodiment method.
Figure 13A:
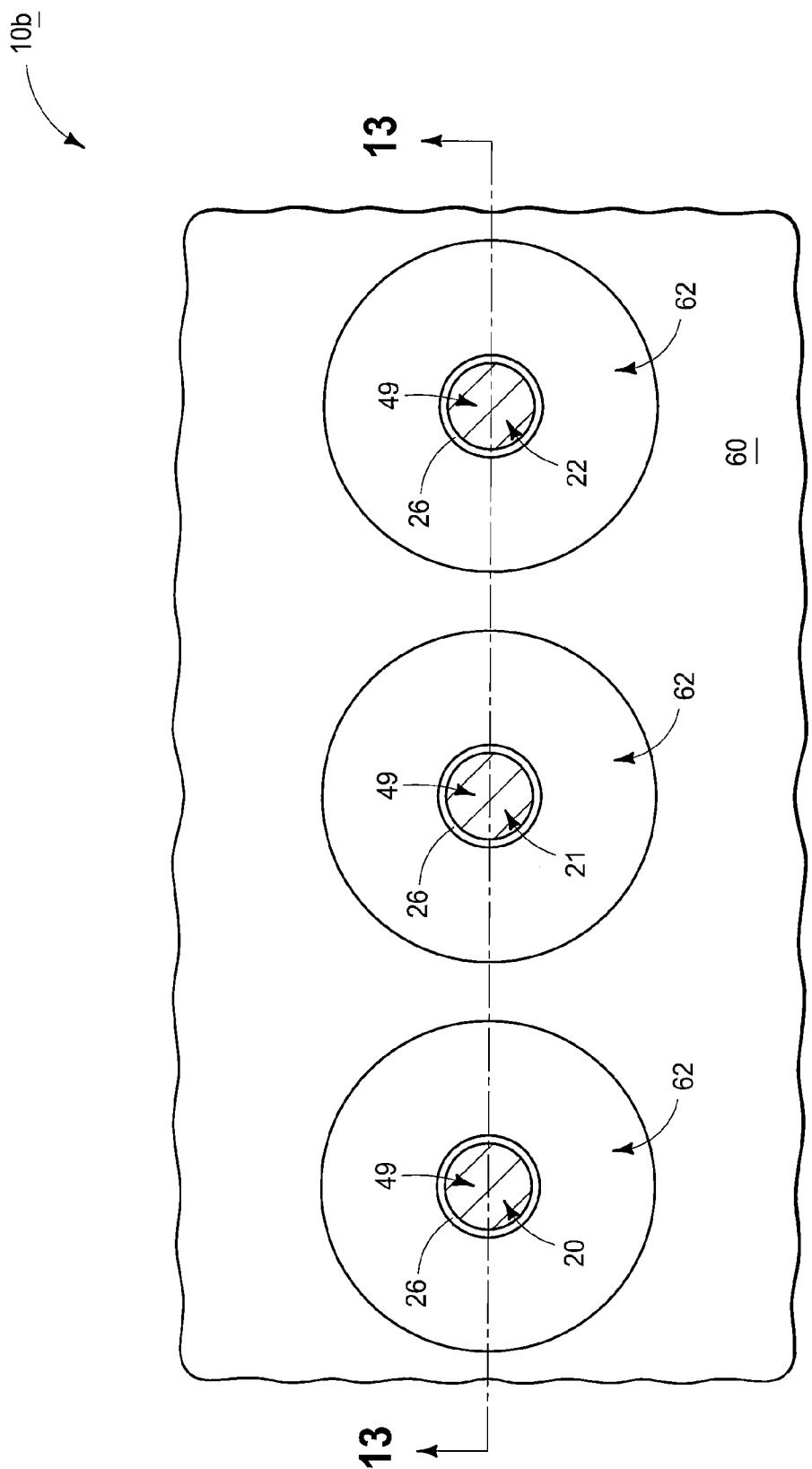
FIG. 13A is a top view of the construction of FIG. 13; with the view of FIG. 13 being along the line 13-13 of FIG. 13A.

Referring to FIGS. 13 and 13A, a construction 10b is shown at a processing stage subsequent to that of FIG. 10. A patterned electrically insulative material 60 is formed over liner 26. The patterned electrically insulative material comprises thin regions 63 and thick regions 65. The thin regions may be considered to define inset regions 62 extending around the planarized upper surfaces 49 of the posts.

Material 60 may comprise any suitable composition or combination of compositions; and may, for example, comprise, consist essentially of, or consist of polyimide. In some embodiments, liner 26 comprises silicon nitride formed by a low-temperature process. Such silicon nitride may have pinholes extending therein, or therethrough. In such embodiments, material 60 may be utilized to plug such pinholes so that electrically conductive material of subsequently-formed caps (specifically, the caps 44b-46b described below with reference to FIG. 15) does not directly contact semiconductor material of base 12.

Material 60 may be patterned utilizing any suitable methodology. In some embodiments, a photoresist mask (not shown) may be formed over an expanse of material 60 utilizing a photolithographic process that creates stepped regions within the mask (for instance, a "leaky" reticle may be utilized for patterning the mask), and then a pattern may be transferred from the photoresist mask to material 60 with one or more appropriate etches. Such may form stepped regions within material 60, with thin portions of the stepped regions corresponding to regions 63, and thick portions of the stepped regions corresponding to regions 65. The photoresist mask may then be removed to leave the construction of FIGS. 13 and 13A.

The upper surfaces of posts 20-22 are exposed through material 60. In some embodiments etching and/or planarization may be conducted after formation of an expanse of material 60 and prior to forming the stepped regions within material 60 to expose the upper surfaces of posts 20-22

Figure 14:
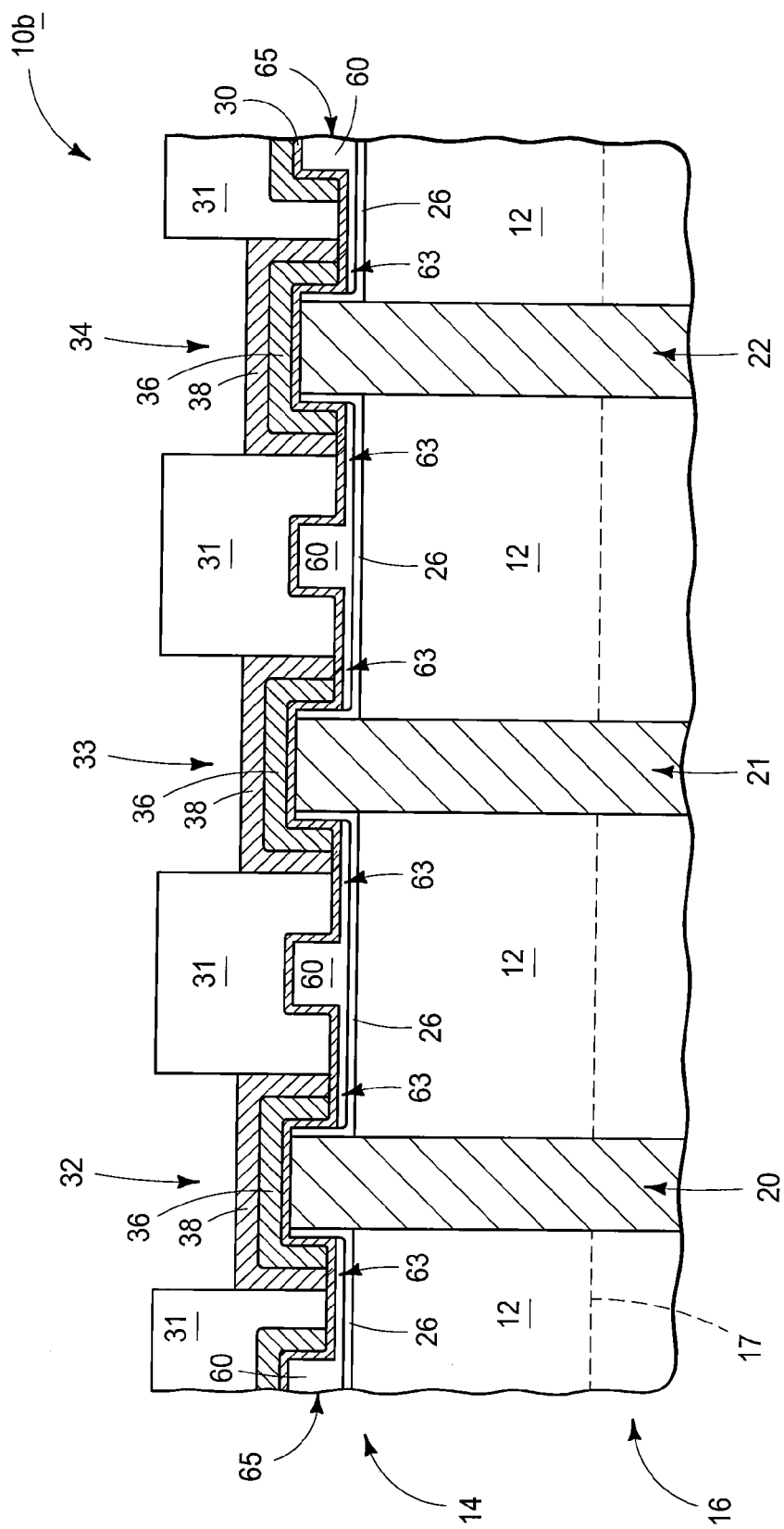

Referring to FIG. 14, construction 10b is shown at a processing stage analogous to that of FIG. 11. Electrically conductive material 30 is formed across material 60 and posts 20-22, patterned masking material 31 is formed over material 30, and the conductive materials 36 and 38 are formed within the openings 32-34 that extend through the masking material 31.

Figure 15:
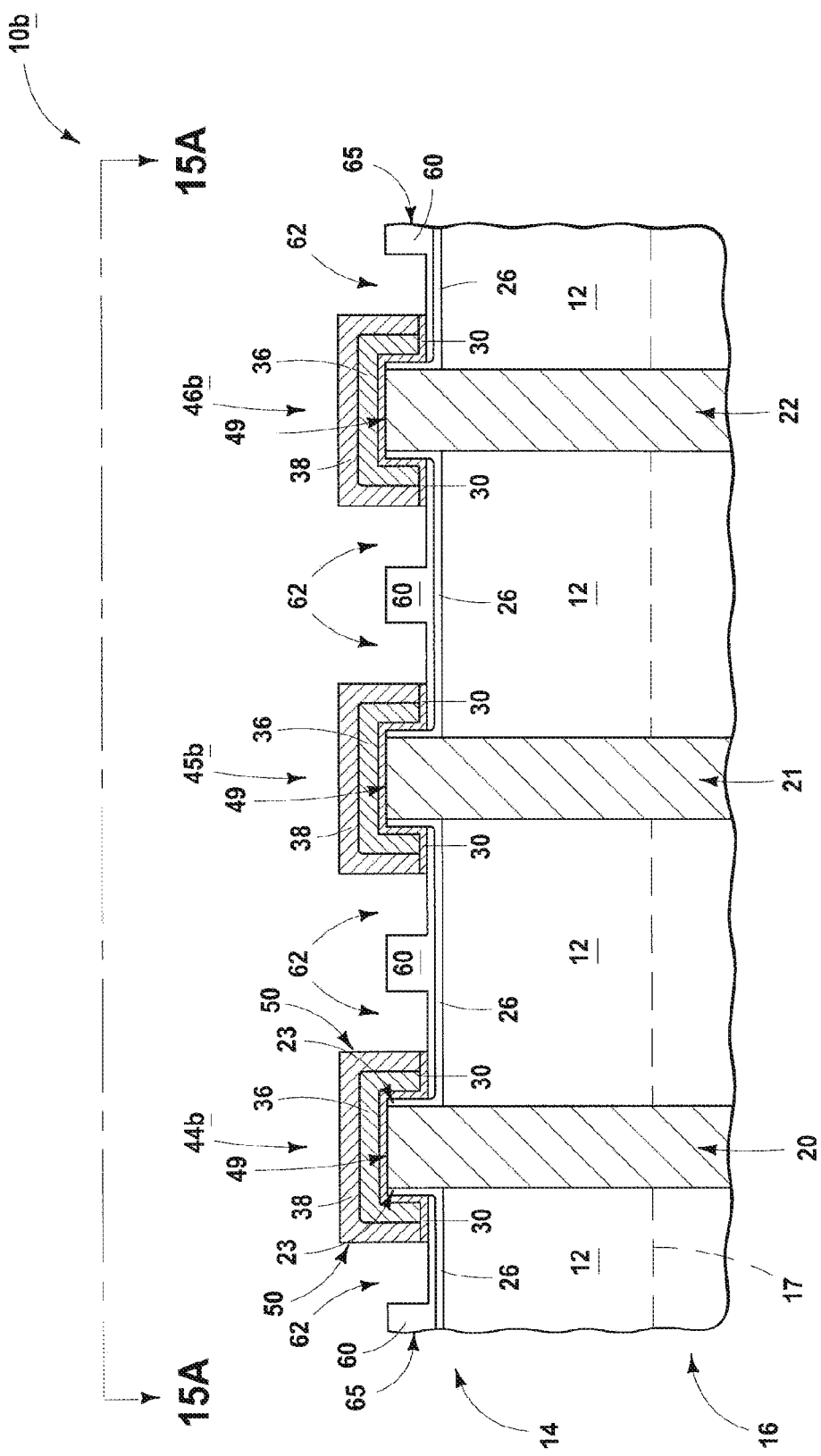
Figure 15A:
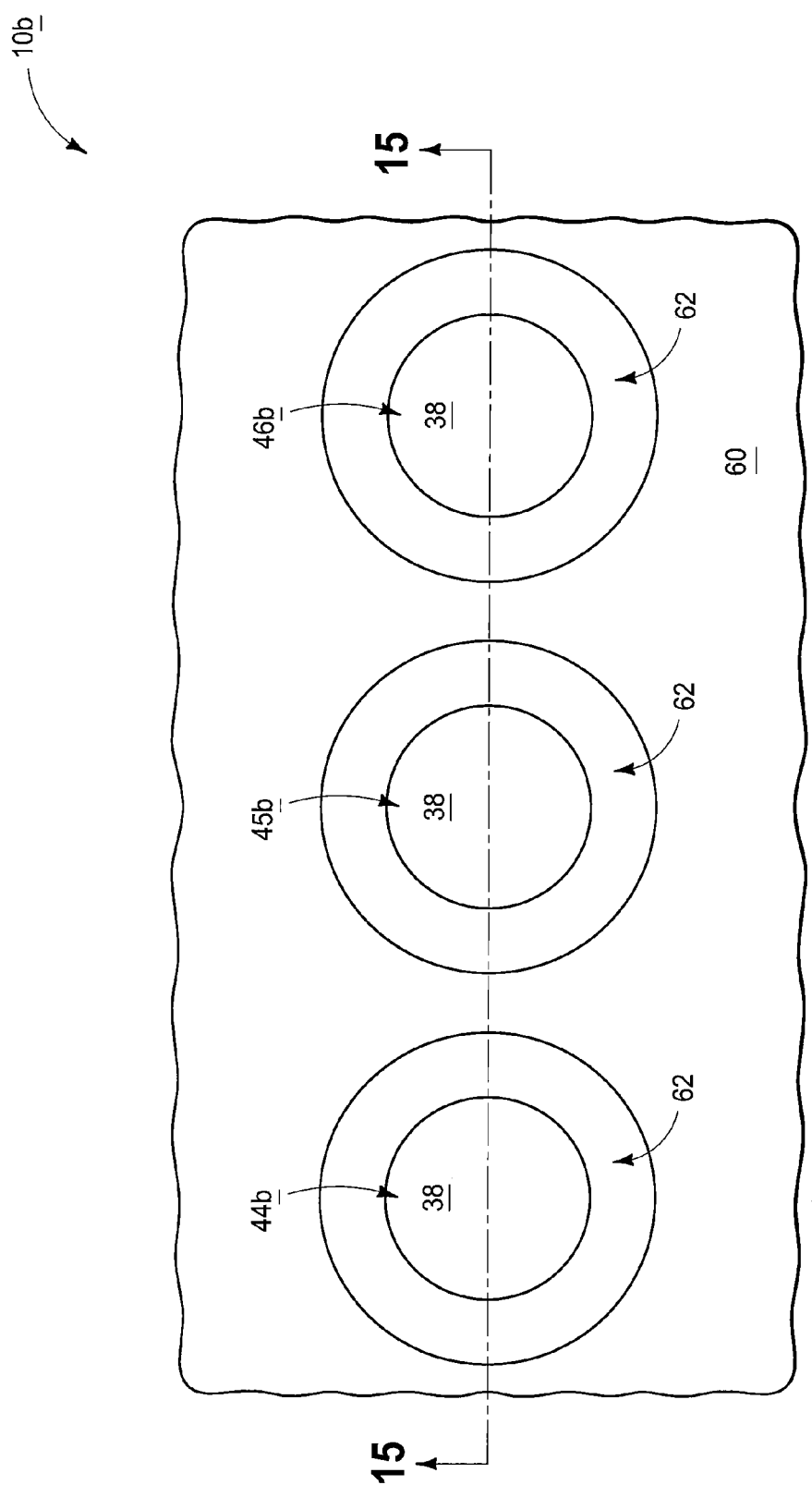

Referring to FIGS. 15 and 15A, construction 10b is shown at a processing stage analogous to that of FIGS. 12 and 12A. The masking material 31 (FIG. 14) has been removed, and materials 30, 36 and 38 are incorporated into a plurality of electrically conductive caps 44b-46b. The caps have the rims extending along the sidewall surfaces of the posts 20 (for instance, the rims 50 of cap 44b extend along the sidewall surfaces 23 of post 20); with the rims being separated from the sidewall surfaces of the posts by liner 26 in the shown embodiment.

Some of the embodiments described herein may advantageously avoid prior art problems associated with planarization across both copper of through-substrate interconnects (for instance, interconnects analogous to the posts 20-22 of FIGS. 1-15) and silicon (for instance, a silicon-containing die analogous to base 12 of FIGS. 1-15). Specifically, the posts 20-22 are planarized simultaneously with an exposed surface comprising liner 26 (the embodiment of FIG. 4), and/or fill material 28 (the embodiment of FIG. 9). Thus, if posts 20-22 comprise copper or another material that smears during planarization, the smeared conductive material will not be directly against semiconductor material of base 12, but will instead the along liner 26 and/or fill material 28. The smeared conductive material may be subsequently removed during removal of the underlying material (for instance, in the embodiment of FIGS. 9 and 10, any conductive material smeared across fill material 28 may be lifted during the removal of the fill material), or may be left over the underlying insulative material if such does not adversely affect performance of the resulting construction.

In some embodiments, advantages of processing described herein may include alleviation or prevention of post grind copper smearing; alleviation or prevention of problems associate with silicon dry etch chemistry (for instance, sulfide formation, non-uniform etch rates, etc.); an ability to hand excess post grind total thickness variation without grinding into posts utilized for through substrate interconnects; and/or elimination of a processing step utilizing a high accuracy stepper.

The liner 26 and/or fill material 28 may provide support to posts 20-22 in some embodiments to alleviate or prevent tipping, bending, breakage, etc., that may occur in prior art process in which analogous posts are not adequately supported during planarization across the posts.

In some embodiments, the constructions described herein may be incorporated into hybrid memory cubic (HMC) architectures; such as, for example, architectures comprising DRAM circuitry stacked over logic circuitry.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of planarizing across a plurality of electrically conductive posts that extend into a semiconductor substrate. A liner is formed across a substrate surface and along sidewall surfaces and top surfaces of the posts. Fill material is formed over the liner and between the posts. The fill material comprises one or more organic compositions. A planarized surface is formed to extend across the posts and across one or both of the liner and the fill material.

Some embodiments include a method of planarizing a plurality of electrically conductive posts that extend into a semiconductor substrate. A liner is formed across a substrate surface and along sidewall surfaces and top surfaces of the posts. The liner comprises one or more inorganic compositions. Fill material is formed over the liner and between the posts. The fill material comprises one or more organic compositions. A planarized surface is formed to extend across the fill material and the posts. After the planarized surface is formed, an etch is used to remove the fill material from between the posts while leaving the liner along sidewall surfaces of the posts and across the substrate surface between the posts. The etch utilized to remove the fill material may, for example, comprise suitable wet chemistry or suitable dry chemistry; and in some embodiments may utilize oxidant.

Some embodiments include a method of planarizing a plurality of electrically conductive posts that extend into a semiconductor substrate. A liner is formed on a substrate surface and along sidewall surfaces and top surfaces of the posts. Fill material is formed over the liner and between the posts. A planarized surface is formed to extend across the posts and the liner. Electrically conductive material is formed over the planarized surface. Electrically conductive caps are formed on the electrically conductive material. The forming of the electrically conductive caps comprises: forming a patterned mask over the electrically conductive material, growing a copper-containing layer over the electrically conductive material within openings that extend through the patterned mask, forming one or both of nickel and palladium on the copper-containing layer within the openings in the patterned mask (the copper-containing layer together with the one or both of nickel and palladium forming spaced-apart stacks over the electrically conductive material), removing the patterned mask, and removing the electrically conductive material from spaces between the stacks.

Some embodiments include a semiconductor construction. The construction has electrically conductive posts extending through a semiconductor die. The posts have upper surfaces above a backside surface of the die, and have sidewall surfaces extending between the backside surface of the die and the upper surfaces. A liner is along the sidewall surfaces of the posts. Electrically conductive caps are directly against the upper surfaces of the posts, and have rims that are along sidewall surfaces of the posts and that are spaced from the sidewall surfaces by the liner.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
   electrically conductive posts extending through a semiconductor die; the posts having upper surfaces above a backside surface of the die, and having sidewall surfaces extending between the backside surface of the die and the upper surfaces;
   a liner along the sidewall surfaces of the posts and along the backside surface of the die; the liner being configured to comprise substantially right angles in transitioning from regions along the sidewall surfaces of the posts to regions along the backside surface of the die;
   electrically conductive caps directly against the upper surfaces of the posts; the caps having rims that are along sidewall surfaces of the posts and that are spaced from the sidewall surfaces by the liner; the rims having bottom surfaces and being configured to comprise substantially right angles in transitioning from regions of the bottom surfaces to regions along the sidewall surfaces of the posts; and
   patterned electrically insulative material defining inset regions around the upper surfaces of the posts; and wherein the rims of the caps extend into the inset regions; the electrically insulative material having thick portions adjacent the inset regions and thin portions corresponding to the inset regions; the rims only being along portions of the inset regions so that other portions of the inset regions extend laterally outward beyond the rims; said other portions of the inset regions being between the rims and the thick portions of the electrically insulative material.

2. The construction of claim 1 wherein the patterned electrically insulative material comprises polyimide.

3. The construction of claim 1 wherein the liner consists of only one homogenous substance.

4. The construction of claim 3 wherein the liner consists of silicon nitride.

5. The construction of claim 1 wherein the liner comprises ruthenium.

6. The construction of claim 5 wherein the electrically conductive posts comprise copper.

7. The construction of claim 1 wherein the liner comprises two or more substances.

8. The construction of claim 1 wherein the electrically conductive caps comprise one or both of nickel and palladium.

* * * * *